US008766675B1

(12) United States Patent
Dreps et al.

(10) Patent No.: US 8,766,675 B1
(45) Date of Patent: Jul. 1, 2014

(54) OVERVOLTAGE PROTECTION CIRCUIT

(71) Applicants: International Business Machines Corporation, Armonk, NY (US); VeriSilcon Holdings Co. Ltd., Santa Clara, CA (US)

(72) Inventors: Daniel M. Dreps, Georgetown, TX (US); Jian Guan, Shanghai (CN); Yi Xiao, Shanghai (CN); WuQuan Zhang, Shanghai (CN)

(73) Assignees: International Business Machines Corporation, Armonk, NY (US); VeriSilicon Holdings, Co. Ltd., George Town (KY)

( * ) Notice: Subject to any disclaimer, the term of this patent is extended or adjusted under 35 U.S.C. 154(b) by 0 days.

(21) Appl. No.: 13/839,926

(22) Filed: Mar. 15, 2013

(51) Int. Cl.
  *H03K 3/00* (2006.01)
  *H02H 3/20* (2006.01)

(52) U.S. Cl.
  USPC ............. 327/112; 327/309; 327/312; 361/90

(58) Field of Classification Search
  CPC .... H03K 19/00315; H03K 5/08; G05F 3/242; G05F 3/247; H02H 3/207; H02H 3/202; H02J 7/0031; G06F 13/4086
  USPC ......... 327/108–112, 436, 309–329, 331–333, 327/170, 530, 379–391, 543, 538, 540, 541, 327/544–547, 427, 434, 437; 326/82, 83, 326/30, 33, 34, 85–87, 90, 31, 32; 361/90, 361/91.1, 91.2, 92
  See application file for complete search history.

(56) References Cited

U.S. PATENT DOCUMENTS

| 4,855,620 | A | | 8/1989 | Duvvury et al. |
| 5,287,241 | A | | 2/1994 | Puar |
| 5,570,043 | A | | 10/1996 | Churchill |
| 5,757,226 | A | * | 5/1998 | Yamada et al. ............... 327/541 |
| 5,825,600 | A | | 10/1998 | Watt |
| 5,870,268 | A | | 2/1999 | Lin et al. |
| 5,963,409 | A | | 10/1999 | Chang |
| 5,973,544 | A | * | 10/1999 | Ohno ............................ 327/530 |
| 6,310,379 | B1 | | 10/2001 | Andersen et al. |

(Continued)

OTHER PUBLICATIONS

Semtech, "RClamp0504M Rail Clamp Low Capacity TVS Diode Array", Aug. 17, 2004; 10 Pages.

(Continued)

*Primary Examiner* — Lincoln Donovan
*Assistant Examiner* — Thomas Skibinski
(74) *Attorney, Agent, or Firm* — David Cain; Roberts Mlotkowski Safran & Cole, P.C.

(57) ABSTRACT

A circuit includes: a pull down circuit including a first PFET and a second PFET connected in series between a pad of a USB circuit and ground; and a pull up circuit including a first NFET and a second NFET connected in series between the pad and a supply voltage. The circuit includes: a third PFET connected to a gate of the first PFET and a gate of the second PFET; a third NFET connected to a gate of the first NFET and a gate of the second NFET; a fourth PFET connected to the first NFET and the second NFET; and a fourth NFET connected to the first PFET and the second PFET. A pad voltage has a nominal minimum and maximum. Each of the first PFET, the second PFET, the first NFET, and the second NFET has a nominal voltage less than the pad voltage nominal maximum.

20 Claims, 3 Drawing Sheets

(56) References Cited

U.S. PATENT DOCUMENTS

| | | |
|---|---|---|
| 6,388,495 B1 * | 5/2002 | Roy et al. .................. 327/309 |
| 6,441,670 B1 | 8/2002 | Coughlin, Jr. et al. |
| 6,515,503 B2 | 2/2003 | Griffin et al. |
| 6,643,110 B2 | 11/2003 | Allen |
| 6,693,469 B2 | 2/2004 | Prodanov |
| 6,842,320 B1 * | 1/2005 | Mathur et al. ............... 361/91.1 |
| 6,906,550 B2 | 6/2005 | Dreps et al. |
| 7,199,612 B2 | 4/2007 | Oertle et al. |
| 7,256,460 B2 | 8/2007 | Salling et al. |
| 7,521,966 B2 | 4/2009 | Chong et al. |
| 7,705,664 B2 | 4/2010 | Tang |
| 7,729,097 B2 | 6/2010 | Ramakrishna et al. |
| 7,835,124 B2 | 11/2010 | Siddhartha et al. |
| 8,166,222 B2 | 4/2012 | Garlapati et al. |
| 8,174,288 B2 | 5/2012 | Dennard et al. |
| 2004/0240127 A1 | 12/2004 | Juliano et al. |
| 2012/0299546 A1 | 11/2012 | Gagne et al. |

OTHER PUBLICATIONS

Sanyo, http://www.soiseek.com/sanyo/vs003e4/, "VS003E4—Noise Clamp for Signal Line (for Low Voltage, USB2.0)", 2009; 2 Pages.

Compaq et al., "Universal Serial Bus Specification", Revision 2.0, Apr. 27, 2000; pp. i-ii and 119-194.

* cited by examiner

OVERVOLTAGE PROTECTION CIRCUIT

FIELD OF THE INVENTION

The invention relates to integrated circuits and, more particularly, to overvoltage protection circuits.

BACKGROUND

The Universal Serial Bus (USB) 3.0 interface requires backward compatibility to USB2. On the one hand, USB 2.0 input/output is designed with 3.3V signaling. On the other hand, USB 3.0 is a low voltage differential that uses separate pins. As complementary metal oxide semiconductor (CMOS) technologies advance to smaller devices, the support of 3.3V devices is becoming more difficult to achieve and adds process steps and cost to all technologies that are 32 nm and smaller. From a system on chip perspective, more of the hub type chip functions are being moved on the mainline processor or on a faster technology node hub chip. Integrating USB 2.0 and USB 3.0 onto the die is thus being requested.

Advanced technologies are tuned for logic performance, and a second thick oxide device is typically offered for other applications. As the base technology scales more aggressively, the thick oxide tends have lower voltage support. For example, many 32 nm thick oxide devices are nominally 1.8V devices. However, such 1.8V devices typically are not suitable for use with 3.3V circuits used in USB 2.0.

SUMMARY

In a first aspect of the invention, there is a circuit that includes a pull down circuit comprising a first PFET and a second PFET connected in series between a pad of a Universal Serial Bus (USB) circuit and ground. The circuit also includes a pull up circuit comprising a first NFET and a second NFET connected in series between the pad and a supply voltage. The circuit additionally includes a third PFET connected to a gate of the first PFET and a gate of the second PFET, and a third NFET connected to a gate of the first NFET and a gate of the second NFET. The circuit also includes a fourth PFET connected to the first NFET and the second NFET, and a fourth NFET connected to the first PFET and the second PFET. A pad voltage has a nominal minimum and a nominal maximum. Each of the first PFET, the second PFET, the first NFET, and the second NFET has a nominal voltage that is less than the pad voltage nominal maximum.

In another aspect of the invention, there is a circuit that includes a first transistor and a second transistor connected in series between a pad and ground, and a first bypass transistor connected between the pad and the second transistor and parallel with the first transistor. The circuit also includes a third transistor and a fourth transistor connected in series between the pad and a supply voltage, and a second bypass transistor connected between the pad and the fourth transistor and parallel with the third transistor. The circuit further includes a control circuit that applies respective bias voltages to each one of the first transistor, the second transistor, the third transistor, and the fourth transistor. The bias voltages are configured to: sequentially turn on the first transistor and the second transistor during an overvoltage condition; and sequentially turn on the third transistor and the fourth transistor during an undervoltage condition.

In another aspect of the invention, there is a method that includes turning off a first PFET, a second PFET, a first NFET, and a second NFET based on a pad voltage of a pad of a Universal Serial Bus (USB) circuit being within a range defined by a nominal minimum and a nominal maximum, wherein each of the first PFET, the second PFET, the first NFET, and the second NFET has a nominal voltage that is less than the nominal maximum. The method includes clamping the pad voltage by sequentially turning on the first PFET and the second PFET based on the pad voltage increasing above the nominal maximum. The method also includes clamping the pad voltage by sequentially turning on the first NFET and the second NFET based on the pad voltage decreasing below the nominal minimum. The method additionally includes biasing a first node between the first PFET and the second PFET using a bypass NFET connected between the pad and the second PFET and parallel to the first PFET. The method further includes biasing a second node between the first NFET and the second NFET using a bypass PFET connected between the pad and the second NFET and parallel to the first NFET.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of a circuit for recycling energy in a clock distribution network which comprises the structures of the present invention. In still further embodiments, a method in a computer-aided design system is provided for generating a functional design model of a protection circuit. The method comprises generating a functional representation of the structural elements of the protection circuit.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to integrated circuits and, more particularly, to overvoltage protection circuits. According to aspects of the invention, there is an overvoltage protection circuit for a USB transceiver having a nominal voltage, the overvoltage protection circuit being constructed with field effect transistors (FETs) having a nominal voltage less than an upper limit of the USB nominal voltage. In embodiments, the USB transceiver has a nominal voltage range of 3.3V and the overvoltage protection circuit comprises stacked 1.8V transistors. In implementations, the protection circuit includes plural 1.8V NFETs connected in series between a pad and rail voltage as a pull-up circuit, and plural 1.8V PFETs connected in series between the pad and ground as a pull-down circuit.

According to aspects of the invention, bias voltages are applied to the gate of each NFET and PFET to control when each transistors turns on and off during an overvoltage or undervoltage situation. The bias voltages and the number of NFETs and PFETs are configured to prevent the drain-to-source voltage of each transistor from exceeding the rated voltage for the transistor. In this manner, implementations of the invention utilize 1.8V devices to provide a protection circuit for a 3.3V USB 2.0 transceiver that may experience input signal overshoot of up to +4.6V (e.g., an overvoltage condition) and undershoot as low as −1.0V (e.g., an undervoltage condition).

Figure 1:
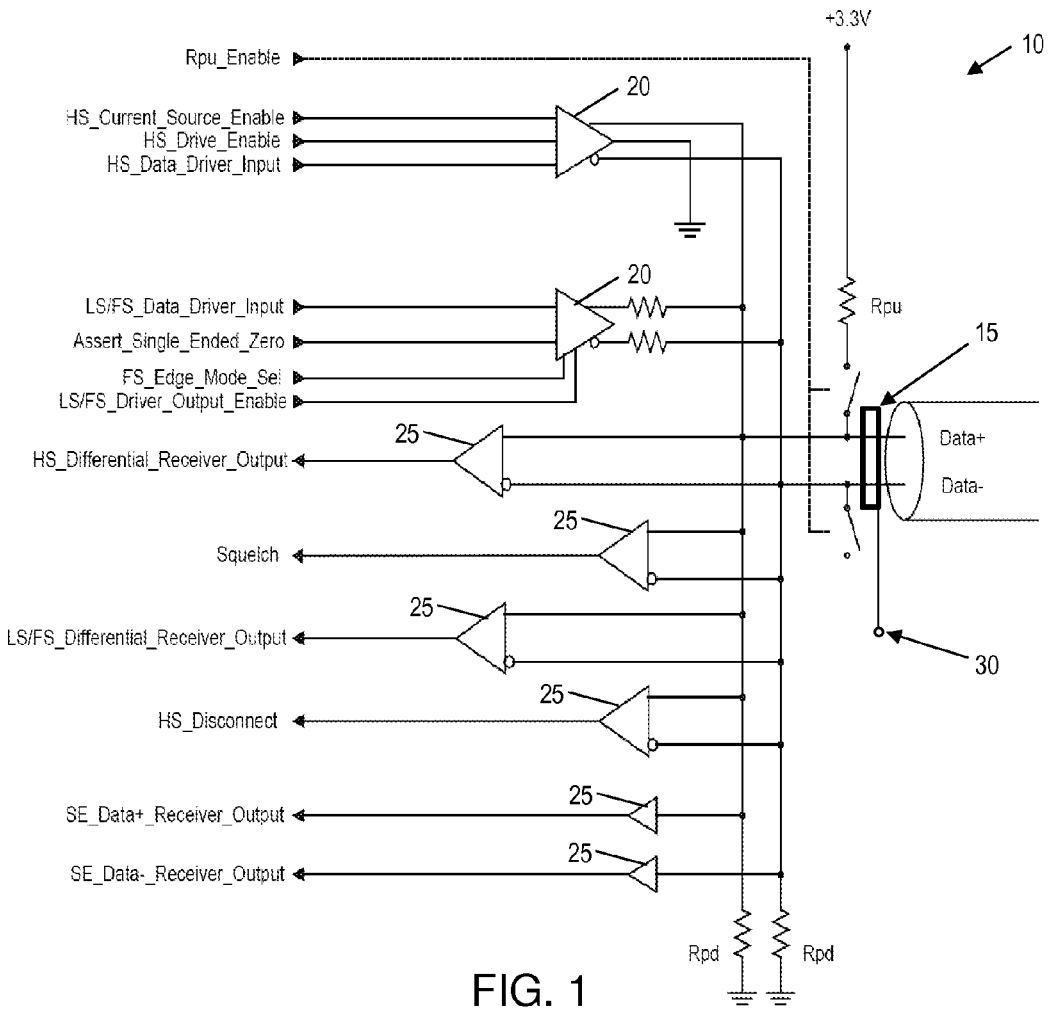
FIG. 1 shows a USB transceiver module with a circuit in accordance with aspects of the invention.

FIG. 1 shows a USB transceiver circuit 10 including a protection circuit 15 in accordance with aspects of the invention. The transceiver circuit 10 is a USB 2.0 circuit that includes conventional drivers 20 and receivers 25, and that has a nominal signal voltage between 0V and 3.3V. In embodiments, the protection circuit 15 is connected to differential signal lines (e.g., Data+ and Data− lines), and is formed internal to the transceiver circuit (e.g., in the same integrated circuit chip). In embodiments, the protection circuit 15 may include an enable/disable pin 30 so that the protection circuit 15 can be controlled to operate only in receiver mode and not in driver mode.

Figure 2:
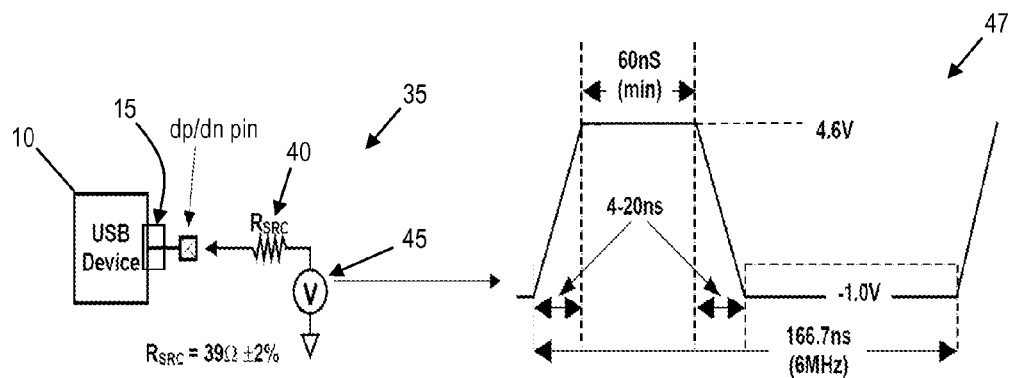
FIG. 2 shows an overvoltage and undervoltage test waveform that is applied to the circuit in accordance with aspects of the invention.

FIG. 2 shows the transceiver circuit 10 including the protection circuit 15 connected to a stress evaluation circuit 35. In embodiments, the Data+ or Data− (dp/dn) pin is connected to a resistance element 40 and a voltage source 45 that generates a waveform 47 with a −1.0V minimum and a +4.6V maximum. The resistance element 40 may be about 39 ohms, although the invention is not limited to this implementation. The stress evaluation circuit 35 represents the maximum input waveforms for compliance with the USB 2.0 specification. Implementations of the invention utilize 1.8V transistors in the protection circuit 15 to meet the stress criteria represented by the stress evaluation circuit 35, e.g., −1.0V undershoot and +4.6V overshoot in the input waveform with predefined transition times (e.g., 4-20 ns).

Figure 3:
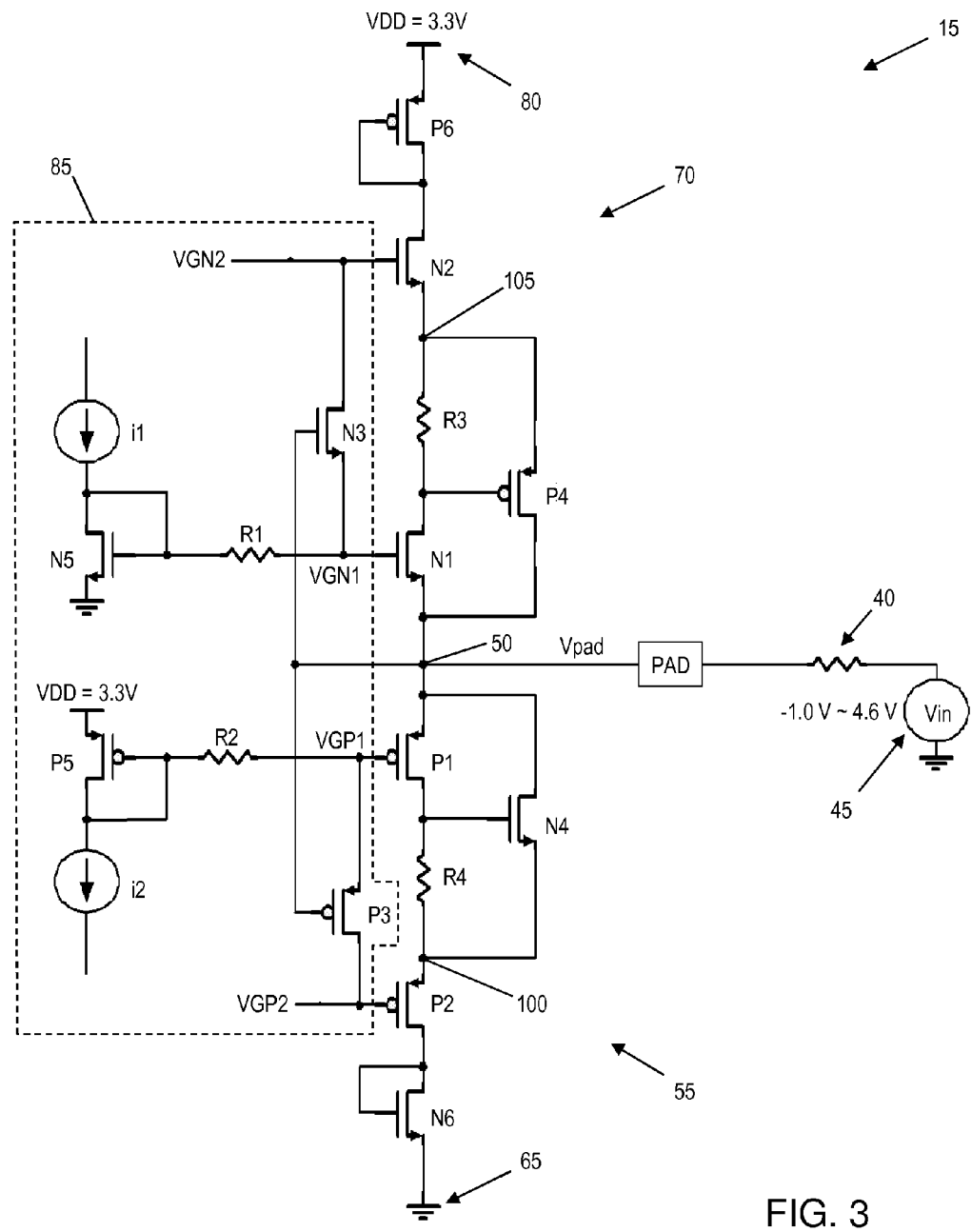
FIG. 3 shows a diagram of a circuit in accordance with aspects of the invention.

FIG. 3 shows a diagram of the protection circuit 15 in accordance with aspects of the invention. In embodiments, the circuit 15 includes a node 50 that corresponds to a pad (PAD) connected to one of the Data+ and Data− lines (e.g., dp/dn pin) of a USB transceiver circuit (e.g., circuit 10) downstream of the resistance element 40 and the voltage source 45. The pad has a pad voltage (Vpad) that is based on an input voltage (Vin) from the voltage source 45. A pull down clamping portion 55 of the circuit 15 includes plural p-type FET (PFET) devices P1 and P2 connected in series between the node 50 and ground 65. A pull up clamping portion 70 includes plural n-type FET (NFET) devices N1 and N2 connected in series between the node 50 and a voltage supply rail 80 (e.g., VDD).

In embodiments, VDD is 3.3V and all the devices P1, P2, N1, and N2 are 1.8V MOSFET devices. In embodiments, the number of transistors in each portion 55 and 70 equals two; however, the invention is not limited to this number, and any suitable number may be used depending on parameters such as VDD and the design voltage of each transistor.

Still referring to FIG. 3, the protection circuit 15 includes a control portion 85 (e.g., a control circuit). In embodiments, the control portion 85 comprises circuitry that provides respective bias voltages: VGN1 to the gate of N1, VGN2 to the gate of N2, VGP1 to the gate of P1, and VGP2 to the gate of P2. In accordance with aspects of the invention, the bias voltages VGN1, VGN2, VGP1, and VGP2 are configured to turn off N1 and N2 and sequentially turn on P1 and P2 as the voltage provided by the voltage source 45 rises above 3.3V to 4.6V (e.g., during an overvoltage condition). Also, the bias voltages VGN1, VGN2, VGP1, and VGP2 are configured to turn off P1 and P2 and sequentially turn on N1 and N2 as the voltage provided by the voltage source 45 falls below 0.0V to −1.0V (e.g., during an undervoltage condition).

In embodiments, a source of NFET N3 (e.g., a modulating transistor) is connected to the gate of N1, and a drain of N3 is connected to the gate of N2. The pad voltage Vpad (i.e., the voltage at node 50) is applied to the gate of N3. The bias voltage VGN1 is supplied to the gate of N1 by a voltage source that includes: a current source i1 connected to a drain of N5, and a resistance element R1 connected between the gate of N5 and the gate of N1, where the drain of N5 is connected to the gate of N5 and the source of N5 is connected to ground.

Similarly, a source of PFET P3 (e.g., a modulating transistor) is connected to the gate of P1, and a drain of P3 is connected to the gate of P2. The pad voltage Vpad is applied to the gate of P3. The bias voltage VGP1 is supplied to the gate of P1 by a voltage source that includes: a current source i2 connected to a drain of P5, and a resistance element R2 connected between the gate of P5 and the gate of P, where the drain of P5 is connected to the gate of P5 and the source of P5 is connected to VDD.

In accordance with aspects of the invention, R1, N5, and i1 are sized to cause VGN1 to be about 1.8V. Similarly, R2, P5, and i2 are sized to cause VGP1 to be about 1.8V. VGN2 and VGP2 are steady state DC voltages that are slightly less than VGN1 and VGP1, respectively. For example, VGN2 and VGP2 may be derived from VDD using a voltage divider or other suitable circuit and may have a value in a range of about 1.5V to 1.7V when VGN1 and VGP1 are 1.8V. The invention is not limited to these particular voltages, however, and any suitable bias voltages VGN1, VGN2, VGP1, and VGP2 may be used within the scope of the invention.

In embodiments, the pull up portion 70 includes a resistance element R3 connected between the drain of N1 and the source of N2. The pull up portion 70 also includes a PFET P4 (e.g., a bypass transistor) having its gate connected to the drain of N1, it source connected to the source of N2, and its drain connected to the source of N1. The pull up portion 70 further includes a PFET P6 with its source connected to VDD, its drain connected to the drain of N2, and its gate connected to its drain. Similarly, the pull down portion 55 includes a resistance element R4 connected between the drain of P1 and the source of P2. The pull down portion 55 also includes an NFET N4 (e.g., a bypass transistor) having its gate connected to the drain of P1, it source connected to the source of P2, and its drain connected to the source of P1. The pull down portion 55 further includes an NFET N6 with its source connected to ground, its drain connected to the drain of P2, and its gate connected to its drain.

Still referring to FIG. 3, P1 and VGP1 are configured such that P1 is off when Vin is between 0.0V and 3.3V. Similarly, N1 and VGN1 are configured such that N1 is off when Vin is between 0.0V and 3.3V. In this manner, the pull down portion 55 and the pull up portion 70 are both off when Vin is in the normal 0.0V to 3.3V operating range.

In operation during an overvoltage condition Vin rises above 3.3V toward 4.6V, which causes Vpad to increase above an upper threshold of normal operation (e.g., above VDD). N1 remains off in this condition since its source voltage (Vpad) exceeds its gate voltage VGN1 (e.g., about 1.8V), and this keeps the pull up portion 70 turned off. P1 on the other hand turns on when Vpad sufficiently exceeds VGP1 due to Vin rising past 3.3V. In embodiments, P2 does not turn on simultaneously with P1. Rather, the threshold voltage of P2 and the magnitude of VGP2 are configured such that P2 remains off for a time after P1 has started conducting. However, as Vpad continues to rise (e.g., due to Vin continuing to rise toward 4.6V), the voltage at node 100 between P1 and P2 (e.g., at the source of P2) eventually rises higher than VGP2 (e.g., at the gate of P2), and this causes P2 to begin conducting, which completes a conductive path between node 50 and ground that pulls down Vpad to within tolerable limits (e.g., clamps Vpad).

Conversely, during an undervoltage condition Vin falls below 0.0V toward −1.0V, which causes Vpad to decrease below a lower threshold of normal operation (e.g., below ground). P1 is off in this condition since its source voltage (Vpad) is less than its gate voltage VGP1 (e.g., about 1.8V), and this keeps the pull down portion 55 turned off. N1 on the other hand turns on when Vpad sufficiently falls below VGN1. Similar to the sequential turning on of P1 and P2, the threshold voltage of N2 and the magnitude of VGN2 are configured such that N2 remains off for a time after N1 has started conducting. However, as Vpad continues to fall (e.g., due to Vin continuing to fall toward −1.0V), the voltage at node 105 between N1 and N2 (e.g., at the source of N2) eventually falls lower than VGN2 (e.g., at the gate of N2), and this causes N2 to begin conducting, which completes a conductive path between node 50 and VDD that pulls up Vpad to within tolerable limits (e.g., clamps Vpad).

In embodiments, the threshold voltages of P1 and P2 and the magnitudes of VGP1 and VGP2 are configured such that the gate to source voltage (VGS) and drain to source voltage (VDS) of each of P1 and P2 do not exceed 1.8V during an overvoltage condition. The threshold voltages of N1 and N2 and the magnitudes of VGN1 and VGN2 are also configured such that the gate to source voltage (VGS) and drain to source voltage (VDS) of each of N1 and N2 do not exceed 1.8V during an undervoltage condition. In this manner, 1.8V devices may be used in a clamping circuit (e.g., the protection circuit) of a 3.3V USB 2.0 transceiver circuit, i.e., the protection devices have a nominal voltage (1.8V) that is less than the nominal maximum voltage of the transceiver circuit (3.3V).

With continued reference to FIG. 3, N3 provides a modulation of VGN1 and P2 provides a modulation of VGP1. In embodiments, VGP1 is about 1.8V, VGP2 is less than VGP1, and P3 provides about 100-200 mV modulation of VGP1 when P3 is on. This modulation pulls VGP1 closer to VGP2 (e.g., lower VGP1 when P3 is on), which affects the gate voltage of P1, which can be used to set the point at which P1 starts to conduct when Vpad goes high. Similarly, when VGN1 is about 1.8V and VGN2 is less than VGN1, N3 provides about 100-200 mV modulation of VGN1 when N3 is on. This modulation pulls VGN1 closer to VGN2, which affects the gate voltage of N1, which can be used to set the point at which N1 starts to conduct when Vpad goes low.

According to aspects of the invention, P4 is used to affect the clamping performance of the pull up portion 70 during an undervoltage event. In implementations, a setup time is needed when Vin drops from 4.6V to −1.0V within 4 ns (as indicated in FIG. 2). Thus, there is overshoot or undershoot on dp/dn, and there is much more current consumption when there is a transition of Vin than when Vin is stable. P4 is connected to provide a parallel cut-in path to provide additional voltage protection for N1, and tunes the internal node biasing to reduce the overvoltage by about 200-300 mV, thus improving reliability of the protection circuit 15. N4 in pull down portion 55 provides similar voltage protection for P1.

Still referring to FIG. 3, P6 is gate-to-drain connected and thus acts as a resistance element between N2 and VDD. Similarly, N6 is gate-to-drain connected and thus acts as a resistance element between P2 and ground. In embodiments, the magnitude of resistance provided by P6 is chosen to tune the voltage at node 105 when N1 and N2 are both on. Similarly, the magnitude of resistance provided by N6 is chosen to tune the voltage at node 100 when P1 and P2 are both on. The magnitudes of resistance elements R1-R4 are similarly set to tune the voltage drop across certain legs of the circuit. In embodiments, R1-R4 are each about 2 k ohm resistance elements, although the invention is not limited to these values and any size elements may be used within the scope of the invention.

Figure 4:
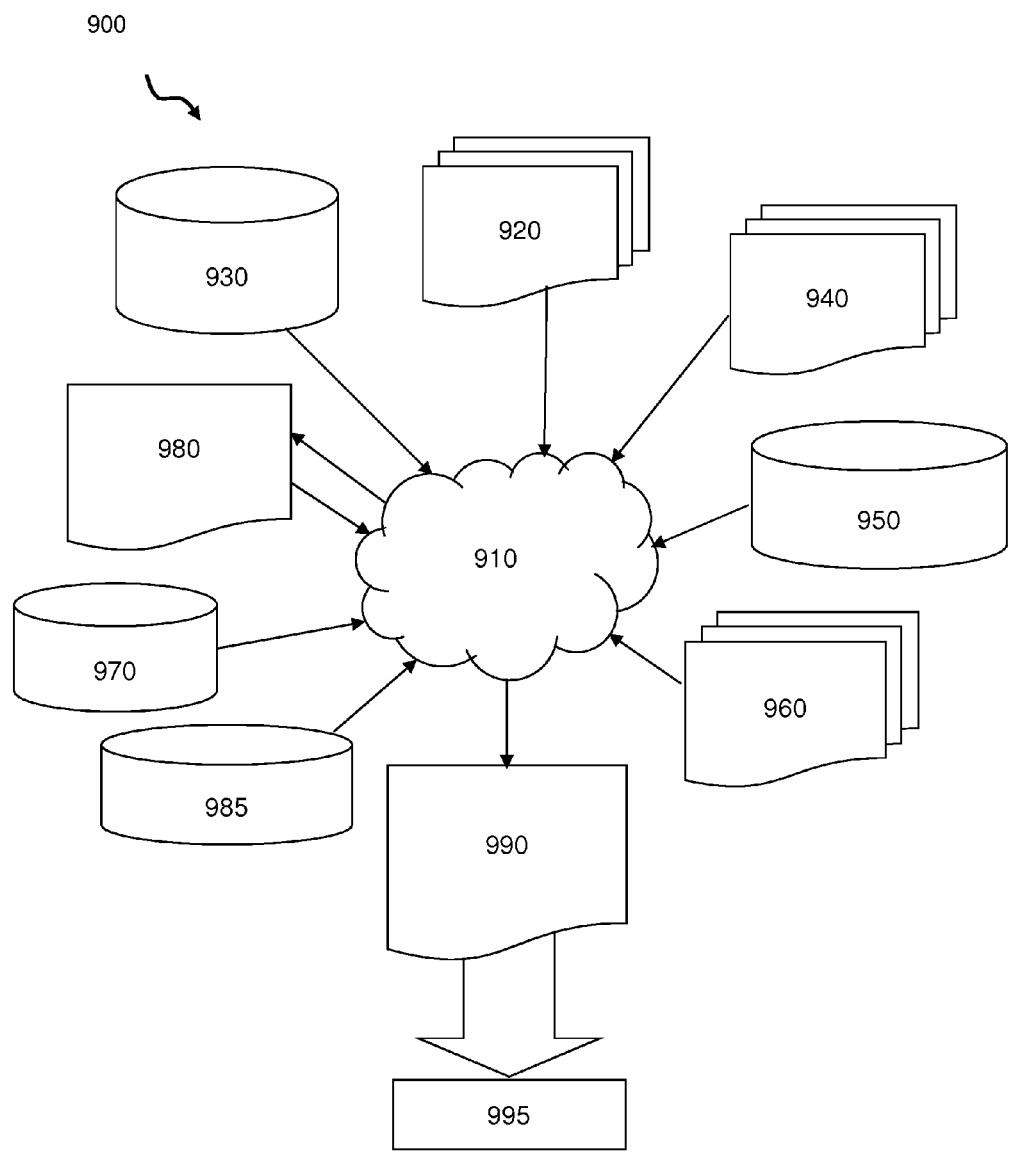
FIG. 4 is a flow diagram of a design process used in semiconductor design, manufacture, and/or test.

FIG. 4 is a flow diagram of a design process used in semiconductor design, manufacture, and/or test. FIG. 4 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIG. 3. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 4 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIG. 3. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIG. 3 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIG. 3. In one embodiment, design structure 990 may comprise a compiled, executable HDL simulation model that functionally simulates the devices shown in FIG. 3.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIG. 3. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A circuit, comprising:
   a pull down circuit comprising a first PFET and a second PFET connected in series between a pad of a Universal Serial Bus (USB) circuit and ground;
   a pull up circuit comprising a first NFET and a second NFET connected in series between the pad and a supply voltage;
   a third PFET connected to a gate of the first PFET and a gate of the second PFET;
   a third NFET connected to a gate of the first NFET and a gate of the second NFET;

a fourth PFET connected to the first NFET and the second NFET; and a fourth NFET connected to the first PFET and the second PFET, wherein a pad voltage has a nominal minimum and a nominal maximum; and each of the first PFET, the second PFET, the first NFET, and the second NFET has a nominal voltage that is less than the pad voltage nominal maximum.

2. The circuit of claim 1, further comprising a control circuit that applies a first bias to a gate of the first PFET, a second bias to a gate of the second PFET, a third bias to a gate of the first NFET, and a fourth bias to a gate of the second NFET.

3. The circuit of claim 2, wherein the second bias is less than the first bias and the fourth bias is less than the third bias.

4. The circuit of claim 1, further comprising a control circuit that is configured to:
- turn off the pull down circuit and turn off the pull up circuit when the pad voltage is between the pad voltage nominal minimum and the pad voltage nominal maximum;
- turn on the pull down circuit when the pad voltage is greater than the pad voltage nominal maximum; and
- turn on the pull up circuit when the pad voltage is less than the pad voltage nominal minimum.

5. The circuit of claim 4, wherein the control circuit is configured to:
- turn on the first PFET before turning on the second PFET during an overvoltage condition; and
- turn on the first NFET before turning on the second NFET during an undervoltage condition.

6. The circuit of claim 1, wherein:
- a source of the third PFET is connected to the gate of the first PFET;
- a drain of the third PFET is connected to the gate of the second PFET;
- a source of the third NFET is connected to the gate of the first NFET; and
- a drain of the third NFET is connected to the gate of the second NFET.

7. The circuit of claim 6, wherein the pad voltage is applied to a gate of the third PFET and a gate of the third NFET.

8. The circuit of claim 1, wherein:
- a source of the fourth NFET is connected to a source of the second PFET;
- a drain of the fourth NFET is connected to a source of the first PFET;
- a gate of the fourth NFET is connected to a drain of the first PFET;
- a source of the fourth PFET is connected to a source of the second NFET;
- a drain of the fourth PFET is connected to a source of the first NFET; and
- a gate of the fourth PFET is connected to a drain of the first NFET.

9. The circuit of claim 8, further comprising:
- a first resistance element connected between a drain of the first NFET and the source of the second NFET; and
- a second resistance element connected between a drain of the first PFET and the source of the second PFET.

10. The circuit of claim 1, wherein the USB circuit comprises a USB 2.0 transceiver circuit.

11. The circuit of claim 1, wherein:
- the pad voltage nominal minimum is 0V;
- the pad voltage nominal maximum is 3.3V; and
- the nominal voltage of each of the first PFET, the second PFET, the first NFET, and the second NFET is 1.8V.

12. A circuit, comprising:
- a first transistor and a second transistor connected in series between a pad and ground;
- a first bypass transistor connected between the pad and the second transistor and parallel with the first transistor;
- a third transistor and a fourth transistor connected in series between the pad and a supply voltage;
- a second bypass transistor connected between the pad and the fourth transistor and parallel with the third transistor; and
- a control circuit that applies respective bias voltages to each one of the first transistor, the second transistor, the third transistor, and the fourth transistor,
- wherein the bias voltages are configured to: sequentially turn on the first transistor and the second transistor during an overvoltage condition; and sequentially turn on the third transistor and the fourth transistor during an undervoltage condition.

13. The circuit of claim 12, wherein the pad is connected to a differential signal line of a transceiver circuit.

14. The circuit of claim 13, wherein:
- the transceiver circuit is a Universal Serial Bus (USB) 2.0 circuit; and
- the pad has a nominal voltage range of 0V to 3.3V.

15. The circuit of claim 14, wherein the first transistor, the second transistor, the third transistor, and the fourth transistor each has a nominal voltage of 1.8V.

16. The circuit of claim 14, wherein the bias voltages are configured to turn off the first transistor, the second transistor, the third transistor, and the fourth transistor when a pad voltage is within the nominal voltage range.

17. The circuit of claim 12, further comprising:
- a first modulating transistor connected to a gate of the first transistor and a gate of the second transistor; and
- a second modulating transistor connected to a gate of the third transistor and a gate of the fourth transistor.

18. The circuit of claim 17, wherein:
- the first modulating transistor modulates the bias voltage of the first transistor based on a pad voltage; and
- the second modulating transistor modulates the bias voltage of the third transistor based on the pad voltage.

19. The circuit of claim 18, wherein:
- the first modulating transistor modulates the bias voltage of the first transistor when the pad voltage is less than a pad voltage nominal minimum; and
- the second modulating transistor modulates the bias voltage of the third transistor when the pad voltage is greater than a pad voltage nominal maximum.

20. A method, comprising:
- turning off a first PFET, a second PFET, a first NFET, and a second NFET based on a pad voltage of a pad of a Universal Serial Bus (USB) circuit being within a range defined by a nominal minimum and a nominal maximum, wherein each of the first PFET, the second PFET, the first NFET, and the second NFET has a nominal voltage that is less than the nominal maximum;
- clamping the pad voltage by sequentially turning on the first PFET and the second PFET based on the pad voltage increasing above the nominal maximum;
- clamping the pad voltage by sequentially turning on the first NFET and the second NFET based on the pad voltage decreasing below the nominal minimum;
- biasing a first node between the first PFET and the second PFET using a bypass NFET connected between the pad and the second PFET and parallel to the first PFET; and biasing a second node between the first NFET and the second NFET using a bypass PFET connected between the pad and the second NFET and parallel to the first NFET.

* * * * *